US009985658B2

(12) United States Patent
Cideciyan et al.

(10) Patent No.: US 9,985,658 B2
(45) Date of Patent: *May 29, 2018

(54) DECODING OF PRODUCT CODES

(71) Applicant: International Business Machines Corporation, Armonk, NY (US)

(72) Inventors: Roy D. Cideciyan, Rueschlikon (CH); Simeon Furrer, Altdorf (CH); Robert A. Hutchins, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/583,742

(22) Filed: May 1, 2017

(65) Prior Publication Data

US 2017/0237447 A1   Aug. 17, 2017

Related U.S. Application Data

(63) Continuation of application No. 15/012,529, filed on Feb. 1, 2016, now Pat. No. 9,673,839, which is a continuation of application No. 14/328,510, filed on Jul. 10, 2014, now Pat. No. 9,287,900.

(51) Int. Cl.
*H03M 13/00* (2006.01)
*H03M 13/29* (2006.01)

(52) U.S. Cl.
CPC ..... *H03M 13/2909* (2013.01); *H03M 13/293* (2013.01); *H03M 13/2951* (2013.01)

(58) Field of Classification Search
CPC ......... H03M 13/2948; H03M 13/2909; H03M 13/2927; H03M 13/293; H03M 13/2951; H03M 13/2975
See application file for complete search history.

(56) References Cited

U.S. PATENT DOCUMENTS

| 4,633,470 A | 12/1986 | Welch et al. |
| 5,684,810 A | 11/1997 | Nakamura et al. |
| 6,182,261 B1 | 1/2001 | Haller et al. |

(Continued)

OTHER PUBLICATIONS

Cideciyan, et al., U.S. Appl. No. 14/328,510, filed Jul. 10, 2014.
(Continued)

*Primary Examiner* — Esaw T Abraham
(74) *Attorney, Agent, or Firm* — Zilka-Kotab, P.C.

(57) ABSTRACT

In one embodiment, a method includes receiving data and in an iterative process until decoded data is output or a predetermined number of full iterations have occurred: C1 decoding all first subsets of the data, determining whether to stop decoding the data after the C1 decoding, incrementing a half iteration counter to indicate completion of a half iteration, C2 decoding all second subsets of the data two or more times in each half iteration using two or more C2-decoding methods in response to a determination that a second subset is not decoded successfully using a first C2-decoding method, determining whether to stop decoding the data after the C2 decoding, incrementing the half iteration counter to indicate completion of another half iteration, and outputting the set of decoded data in response to a determination that all subsets of the data are decoded successfully.

14 Claims, 11 Drawing Sheets

(56) References Cited

U.S. PATENT DOCUMENTS

| | | |
|---|---|---|
| 6,518,812 B1 | 2/2003 | Sikkink et al. |
| 6,615,385 B1 | 9/2003 | Kim et al. |
| 6,686,853 B2 | 2/2004 | Shen et al. |
| 7,370,258 B2 | 5/2008 | Iancu et al. |
| 7,596,196 B1 | 9/2009 | Liu et al. |
| 7,765,453 B2 | 7/2010 | Duggan |
| 8,086,928 B2 | 12/2011 | Jalloul et al. |
| 8,250,438 B2 | 8/2012 | Haratsch |
| 8,438,461 B2 * | 5/2013 | Varnica ............... H03M 13/112 714/774 |
| 8,468,428 B1 * | 6/2013 | Matache ........... H03M 13/2969 714/780 |
| 8,504,887 B1 * | 8/2013 | Varnica ............. H03M 13/1111 714/730 |
| 8,527,843 B2 | 9/2013 | Ramesh et al. |
| 8,532,229 B2 * | 9/2013 | Dowling ............... H04L 1/0051 375/286 |
| 8,555,131 B2 * | 10/2013 | Rault ................ H03M 13/1128 713/324 |
| 8,578,238 B2 | 11/2013 | Priewasser et al. |
| 8,677,227 B2 * | 3/2014 | Gross ................ H03M 13/1117 714/807 |
| 8,689,084 B1 | 4/2014 | Tai |
| 8,694,850 B1 | 4/2014 | Tang |
| 8,930,791 B2 * | 1/2015 | Li ........................... H04L 1/005 714/757 |
| 8,989,252 B1 | 3/2015 | Varnica et al. |
| 8,990,652 B2 * | 3/2015 | Park ................. H03M 13/2975 714/751 |
| 9,118,350 B2 * | 8/2015 | Fonseka ............ H03M 13/2909 |
| 9,143,166 B1 * | 9/2015 | Tang ..................... H03M 13/09 |
| 9,240,808 B2 * | 1/2016 | Fonseka .............. H03M 13/253 |
| 9,287,900 B2 | 3/2016 | Cideciyan et al. |
| 9,673,839 B2 | 6/2017 | Cideciyan et al. |
| 2016/0013814 A1 | 1/2016 | Cideciyan et al. |
| 2016/0164542 A1 | 6/2016 | Cideciyan et al. |

OTHER PUBLICATIONS

Notice of Allowance from U.S. Appl. No. 14/328,510, dated Nov. 16, 2015.
Guruswami et al., "Improved Decoding of Reed-Solomon and Algebraic-Geometric Codes," Electronic Colloquium on Computational Complexity, Report No. 43, Jul. 27, 1998, pp. 1-15.
Sudan, M., "Decoding of Reed Solomon codes beyond the error-correction bound," Journal of Complexity, vol. 13, 1997, pp. 180-193.
Guruswami et al., "Improved Decoding of Reed-Solomon and Algebraic-Geometry Codes," IEEE Transactions on Information Theory, vol. 45, No. 6, Sep. 1999, pp. 1757-1767.
Cideciyan, et al., U.S. Appl. No. 15/012,529, filed Feb. 1, 2016.
Non-Final Office Action from U.S. Appl. No. 15/012,529, dated Jul. 13, 2016.
Final Office Action from U.S. Appl. No. 15/012,529, dated Nov. 22, 2016.
Notice of Allowance from U.S. Appl. No. 15/012,529, dated Feb. 2, 2017.
List of IBM Patents or Patent Applications Treated as Related.

\* cited by examiner

DECODING OF PRODUCT CODES

BACKGROUND

The present invention relates to decoding data, and more specifically, this invention relates to improved decoding of data stored using product code.

Error correction code (ECC) is widely used in magnetic tape storage and optical storage. A particular type of ECC, product error correction code, provides significant gains in error rate performance by decreasing raw channel bit error rates from the range of $1 \times 10^{-2}$ to $1 \times 10^{-4}$ at the input of the ECC decoder to user bit error rates less than $1 \times 10^{-17}$ to $1 \times 10^{-20}$. This high-level of data integrity is required in linear tape open (LTO) and proprietary enterprise tape drives.

However, there are still some instances in which greater error reduction would be beneficial. Therefore, enhanced decoding algorithms that allow further reduction in the user error rate thus providing improved error rate performance and/or increased robustness to channel conditions in a power-efficient manner would be useful.

SUMMARY

In one embodiment, a system includes a processor and logic integrated with and/or executable by the processor. The logic is configured to cause the processor to receive a set of data and perform an iterative process until a set of decoded data is output or a predetermined number of full iterations have occurred. The iterative process includes logic configured to cause the processor to C1 decode all first subsets of the set of data and determine whether to stop decoding the set of data after the C1 decoding. The iterative process also includes logic configured to cause the processor to increment a half iteration counter to indicate completion of a half iteration and C2 decode all second subsets of the set of data two or more times in each half iteration using two or more C2-decoding methods in response to a determination that a second subset is not decoded successfully using a first C2-decoding method. Also, the iterative process includes logic configured to cause the processor to determine whether to stop decoding the set of data after the C2 decoding and increment the half iteration counter to indicate completion of another half iteration. Moreover, the iterative process includes logic configured to cause the processor to output the set of decoded data in response to a determination that all subsets of the set of data are decoded successfully. In the iterative process, C1 decoding and C2 decoding are performed on the set of data as modified by any previous decoding attempts.

According to another embodiment, a method includes receiving a set of data and in an iterative process until a set of decoded data is output or a predetermined number of full iterations have occurred: C1 decoding all first subsets of the set of data, determining whether to stop decoding the set of data after the C1 decoding, and incrementing a half iteration counter to indicate completion of a half iteration. Also, in the iterative process: C2 decoding all second subsets of the set of data two or more times in each half iteration using two or more C2-decoding methods in response to a determination that a second subset is not decoded successfully using a first C2-decoding method, determining whether to stop decoding the set of data after the C2 decoding, incrementing the half iteration counter to indicate completion of another half iteration, and outputting the set of decoded data in response to a determination that all subsets of the set of data are decoded successfully. C1 decoding and C2 decoding are performed on the set of data as modified by any previous decoding attempts in the iterative process.

Other aspects and embodiments of the present invention will become apparent from the following detailed description, which, when taken in conjunction with the drawings, illustrate by way of example the principles of the invention.

DETAILED DESCRIPTION

Figure 1A:
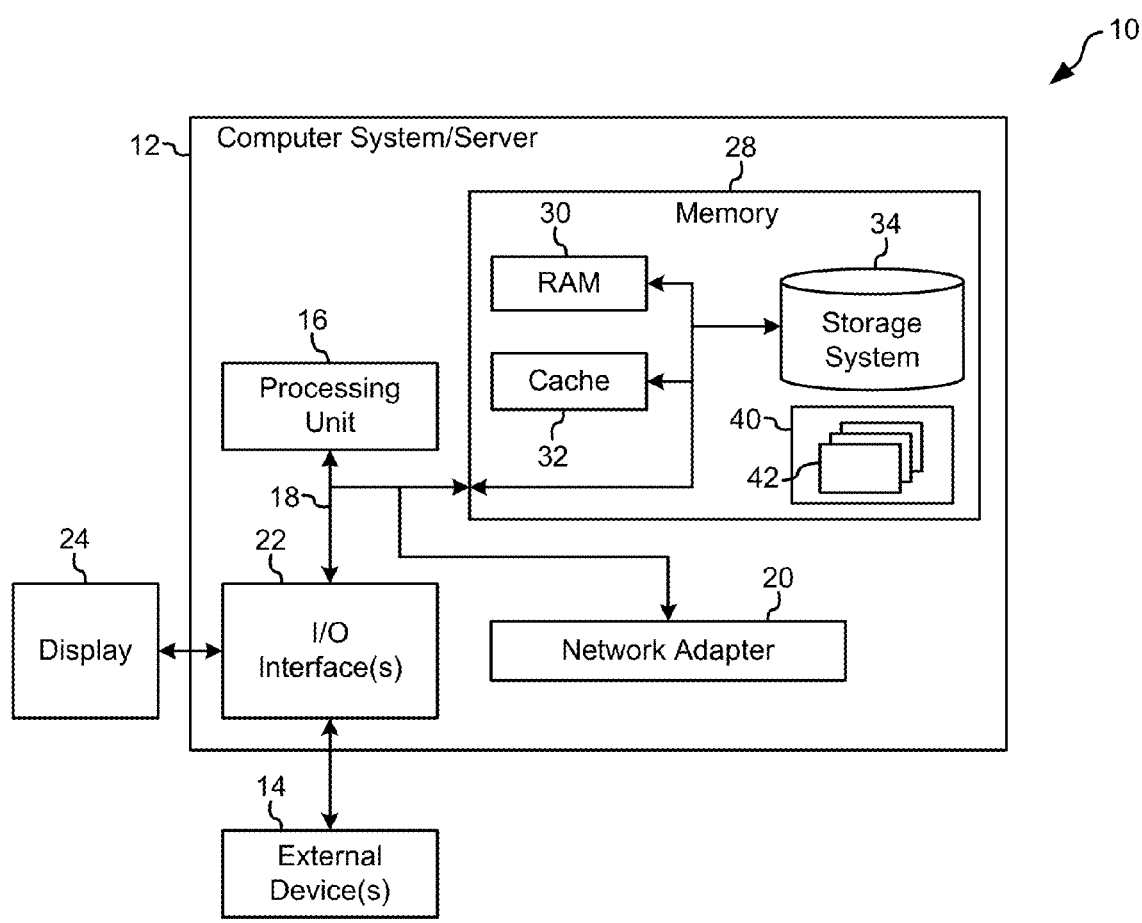
FIG. 1A illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods, and computer program products for decoding a received row or column of a product codeword up to two times per half iteration, the first time by a first type of error decoding (such as error-only decoding) and the second time by a second type of error decoding (such as error-and-erasure decoding) using information from a previous iteration. Judicious use of limited decoding hardware resources are ensured with this scheme, along with significant gains in performance. Specifically, error rates may be reduced by up to two orders in magnitude or more.

In one general embodiment, a system includes a processor and logic integrated with and/or executable by the processor, the logic being configured to receive a set of data and in an iterative process until a set of decoded data is output or a predetermined number of C1 and/or C2 iterations have occurred: C1 decode all first subsets of the set of data two or more times in each half iteration using two or more C1-decoding methods when a first subset is not decoded successfully using a first C1-decoding method, determine whether to stop decoding the set of data after the C1 decoding and output results of the C1 decoding, increment a half iteration counter to indicate completion of a half iteration when decoding is not stopped, C2 decode all second subsets of the set of data, determine whether to stop decoding the set of data after the C2 decoding and output results of the C2 decoding, increment the half iteration counter to indicate completion of another half iteration when decoding is not stopped, and output the set of decoded data when all subsets of the set of data are decoded successfully, wherein C1 decoding and C2 decoding are performed on the set of data as modified by any previous decoding attempts.

In another general embodiment, a computer program product for decoding data, the computer program product includes a computer readable storage medium having program code embodied therewith, the program code being readable and/or executable by a processor to cause the processor to: receive by the processor a set of data and in an iterative process until a set of decoded data is output or a predetermined number of full iterations have occurred: C1 decode all first subsets of the set of data, determine, by the processor, whether to stop decoding the set of data after the C1 decoding, increment a half iteration counter to indicate completion of a half iteration, C2 decode all second subsets of the set of data two or more times in each half iteration using two or more C2-decoding methods when a second subset is not decoded successfully using a first C2-decoding method, determine whether to stop decoding the set of data after the C2 decoding, increment the half iteration counter to indicate completion of another half iteration, and output the set of decoded data when all subsets of the set of data are decoded successfully, wherein C1 decoding and C2 decoding are performed on the set of data as modified by any previous decoding attempts.

According to yet another general embodiment, a method for decoding data includes receiving a set of data and in an iterative process until a set of decoded data is output or a predetermined number of iterations have occurred: C1 decoding each C1-codeword of the set of data using a first C1-decoding method followed by a second C1-decoding method different from the first C1-decoding method when a first subset is not decoded successfully using the first C1-decoding method, wherein the C1-codewords are either rows or columns of a data array representing the set of data, and wherein the second C1-decoding method uses soft information, when available, from a previous C2 decoding of the set of data, determining whether an iteration limit has been reached or a set of decoded data has been produced after the C1 decoding, outputting the set of decoded data when the C1 decoding is successful, incrementing an iteration counter to indicate completion of an iteration when the C1 decoding is not successful, C2 decoding each C2-codeword of the set of data using a first C2-decoding method followed by a second C2-decoding method different from the first C2-decoding method when a second subset is not decoded successfully using the first C2-decoding method, wherein the second C2-decoding method uses soft information from a previous C1 decoding of the set of data, and wherein the C2-codewords are either rows or columns of the data array representing the set of data different from the C1-codewords, determining whether the iteration limit has been reached or the set of decoded data has been produced after the C2 decoding, outputting the set of decoded data when the C2 decoding is successful, and incrementing the iteration counter to indicate completion of an iteration when the C2 decoding is not successful, wherein C1 decoding and C2 decoding are performed on the set of data as modified by any previous decoding attempts.

Referring now to FIG. 1A, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1A, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a hard disk drive (HDD). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 1B:
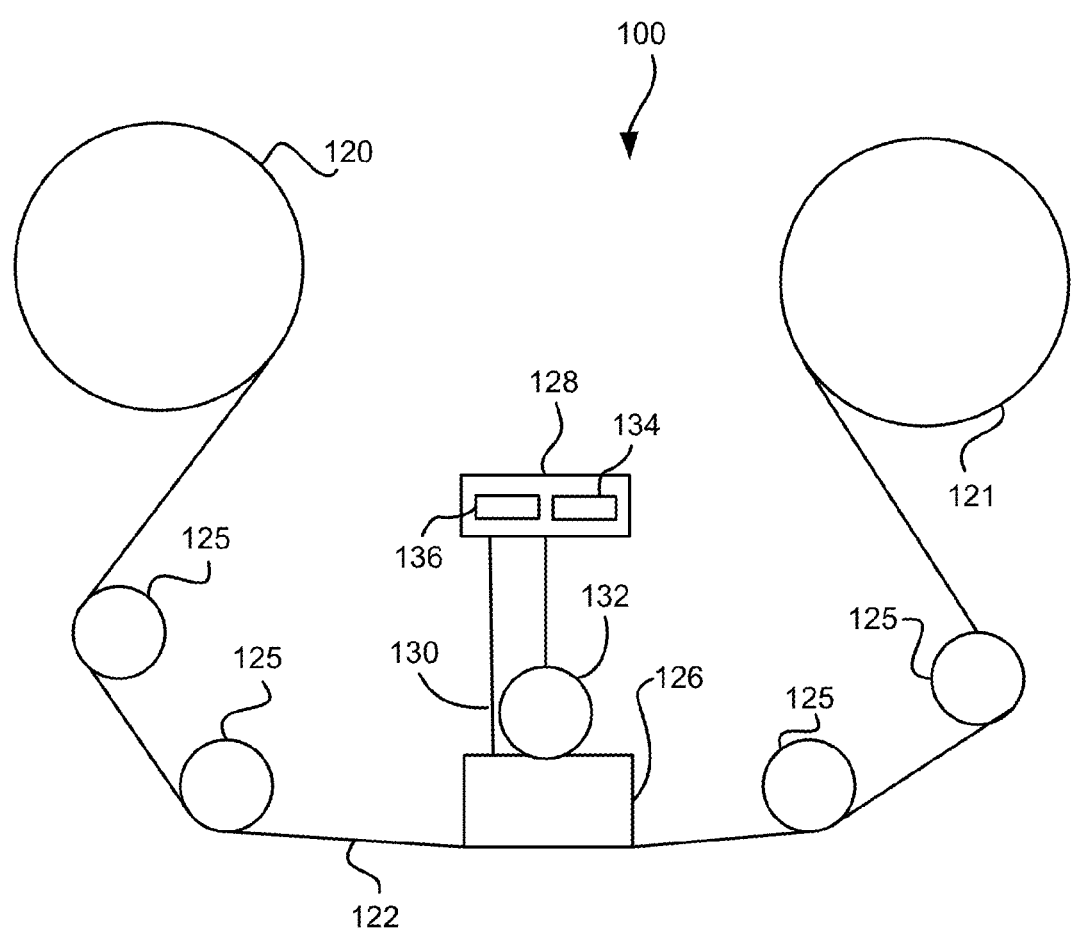
FIG. 1B illustrates a simplified tape drive of a tape-based data storage system, according to one embodiment.

FIG. 1B illustrates a simplified tape drive 100 of a tape-based data storage system, which may be employed according to various embodiments. While one specific implementation of a tape drive is shown in FIG. 1B, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1B, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 1B) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive 100 and a host (integral or external) to send and receive the data and for controlling the operation of the tape drive 100 and communicating the status of the tape drive 100 to the host, as would be understood by one of skill in the art.

Error Correction Coding (ECC) is used in data storage to achieve very low bit error rates, e.g., magnetic tape storage products are designed to ensure bit error rates in the range of $1 \times 10^{-17}$ to $1 \times 10^{-19}$ under normal operating conditions. Product codes and linear block codes, such as Reed-Solomon (RS) codes and low-density parity-check (LDPC) codes, have generally been preferred ECC schemes used in data storage products.

Figure 2A:
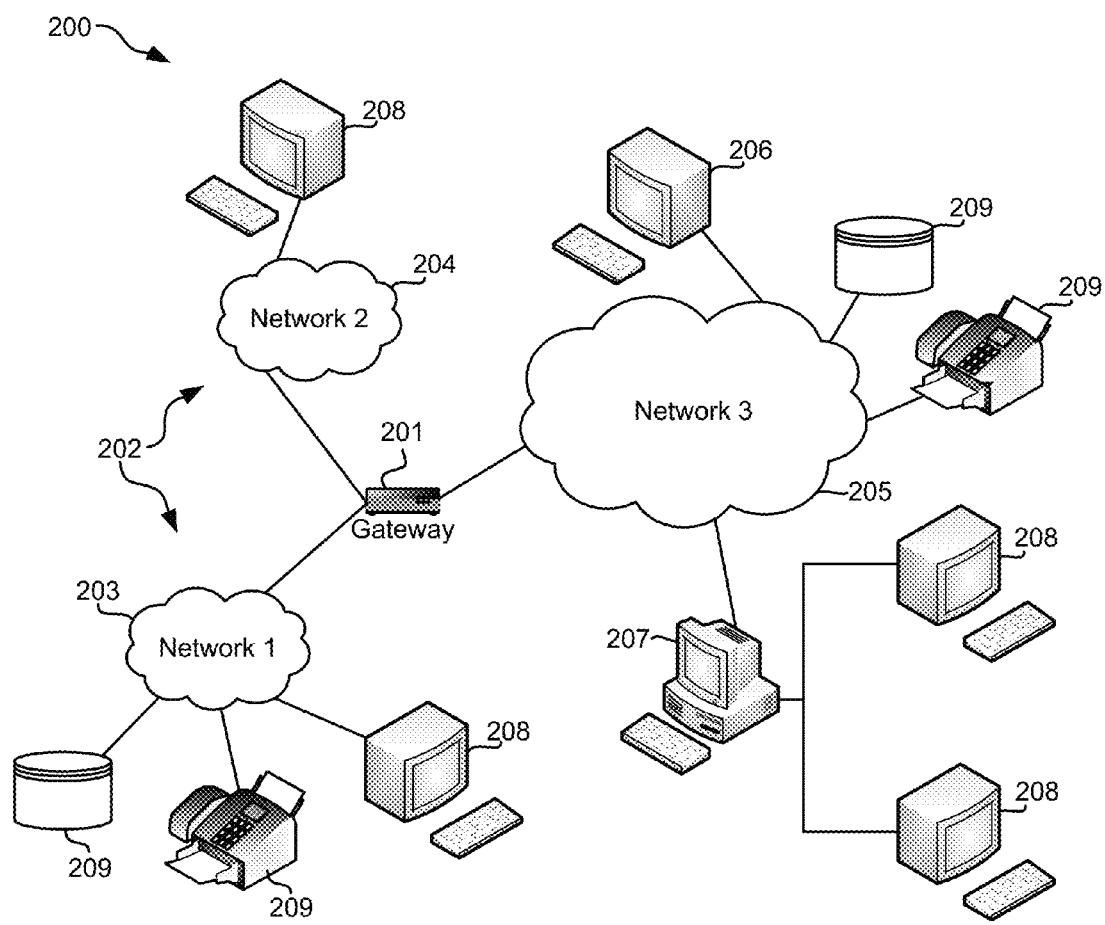
FIG. 2A illustrates a network architecture, in accordance with one embodiment.

FIG. 2A illustrates an architecture 200, in accordance with one embodiment. As shown in FIG. 2A, a plurality of remote networks 202 are provided including a first remote network 203 and a second remote network 204. A gateway 201 may be coupled between the remote networks 202 and a proximate network 205. In the context of the present architecture 200, the networks 203, 204, 205 may each take any form including, but not limited to a LAN, a WAN such as the Internet, public switched telephone network (PSTN), internal telephone network, etc.

In use, the gateway 201 serves as an entrance point from the remote networks 202 to the proximate network 205. As such, the gateway 201 may function as a router, which is capable of directing a given packet of data that arrives at the gateway 201, and a switch, which furnishes the actual path in and out of the gateway 201 for a given packet.

Further included is at least one data server 207 coupled to the proximate network 205, and which is accessible from the remote networks 202 via the gateway 201. It should be noted that the data server(s) 207 may include any type of computing device/groupware. Coupled to each data server 207 is a plurality of user devices 208. Such user devices 208 may include a desktop computer, lap-top computer, hand-held computer, printer or any other type of logic. It should be noted that a user device 206 may also be directly coupled to any of the networks, in one embodiment.

A peripheral 209 or series of peripherals 209, e.g., facsimile machines, printers, networked and/or local storage units or systems, etc., may be coupled to one or more of the networks 203, 204, 205. It should be noted that databases and/or additional components may be utilized with, or integrated into, any type of network element coupled to the networks 203, 204, 205. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 203, 204, 205, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2B:
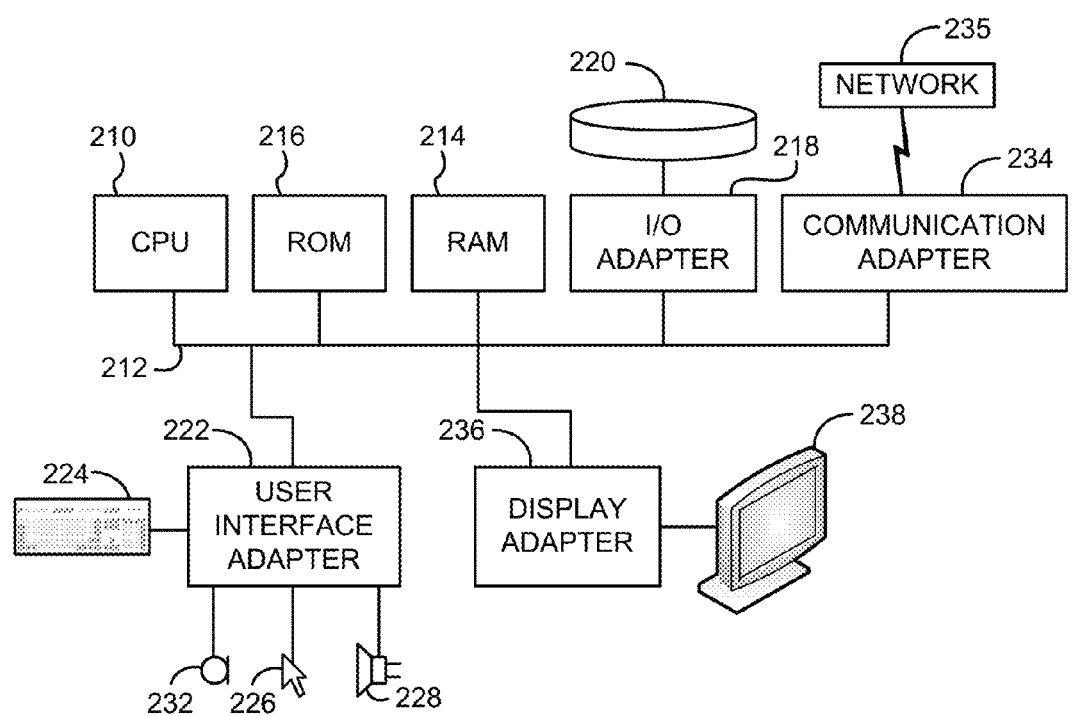
FIG. 2B shows a representative hardware environment that may be associated with the servers and/or clients of FIG. 2A, in accordance with one embodiment.

FIG. 2B shows a representative hardware environment associated with a user device 208 and/or server 207 of FIG. 2A, in accordance with one embodiment. Such figure illustrates a typical hardware configuration of a workstation having a central processing unit 210, such as a microprocessor, and a number of other units interconnected via a system bus 212.

The workstation shown in FIG. 2B includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using XML, C, and/or C++ language, or other programming languages, along with an object oriented programming methodology. Object oriented programming (OOP), which has become increasingly used to develop complex applications, may be used.

Conventionally, RS encoders at a transmitter (a write side in the context of data storage) take a number of information symbols (K) at an input of the encoder, where each symbol consists of a number of bits (m), with a preferred choice for the size of m being eight, e.g., in one embodiment, m=8, with the symbols being bytes. The RS encoder then generates, in a first step, a number of N−K symbols, which are known as "parity symbols," "overhead," or "redundancy," as a linear function of the K input symbols and appends, in a second step, the generated (N−K) parity symbols at an end of the K information symbols to obtain an N-symbol RS codeword where N>K. Note that for typical RS codes, $N<2^m$, whereas for extended RS codes, $N=2^m$ or $N=2^m+1$. Therefore, in general, $N<2^m+2$.

This is referred to as generating code words from a RS(N,K) code. The minimum Hamming distance (d) of a RS(N,K) code is d=N−K+1. This means that any two RS(N,K) code words differ by d or more symbols, where there are a total of $(2^m)^K$ RS(N,K) code words. RS(N,K) codes may also be referred to as RS(N,K,d) codes, thereby including the indication of the minimum Hamming distance in the notation. The m-bit symbols of an RS code are from a Galois field (GF) with $2^m$ symbols. Therefore, RS codes may also be referred to as RS(N,K,d) codes over GF($2^m$). The RS parity symbols may be generated using a linear feedback shift register circuit, or some other technique known in the art. A RS encoder which appends generated parity symbols to the information symbols is known in the art as a "systematic encoder."

A RS decoder for a RS(N,K,d) code over GF($2^m$) at a receiver (a read side in the context of data storage) is capable of correcting t symbols, where t=floor((N−K)/2). In other words, up to t symbols in an N-symbol RS code word may be corrupted and the RS decoder is still capable of correcting these t erroneous m-bit symbols, where each erroneous m-bit symbol contains at least 1 bit error and at most m bit errors. This RS decoder has an error correction capability of t. Sometimes, the RS decoder may use additional information about locations of erroneous symbols within a code word. In other words, the RS decoder is aware of which symbols are in error but does not know how many bits, nor which bits in the erroneous symbols are wrong. This is the case for erasure correction. The RS decoder is capable of correcting up to e erased symbols, where e=(N−K). In this case, the RS decoder is aware of locations of the erroneous symbols. In general, the RS decoder is capable of correcting e' erased symbols and t' erroneous symbols with unknown locations when (e'+2t')<d, where d=(N−K+1).

If there are t=floor((N−K)/2) or less erroneous symbols (or e=(N−K) or less erased symbols) in a RS code word (in the most general case: (e'+2t')<d=(N−K+1)), a bounded-distance RS decoder (in practice, most RS decoders are of a bounded-distance type) corrects all erroneous symbols and erased symbols. If there are more than t erroneous symbols (or more than e erased symbols) in a RS code word (in the most general case: (e'+2t')>(N−K)), two things may occur at the output of the bounded-distance RS decoder.

The most likely occurrence is that the RS decoder raises a decoding failure flag which indicates that the total number of erroneous symbols and erased symbols exceeds the error correction capability of the RS decoder. In a less likely outcome, the total number of erroneous symbols and erased symbols may cause the receiver's corrupted RS code word to become very close to another RS code word and the RS decoder may correct the errors and the erased symbols and output an erroneous RS code word. In this case, a "miscorrection" occurred and the RS decoder is not aware that a mistake was made. The most likely miscorrection case is when the decoded RS code word differs in d=N−K+1 symbols from the original RS code word. Finally, the RS decoder drops the parity symbols from the decoded RS code word to recover the information symbols.

Figure 3:
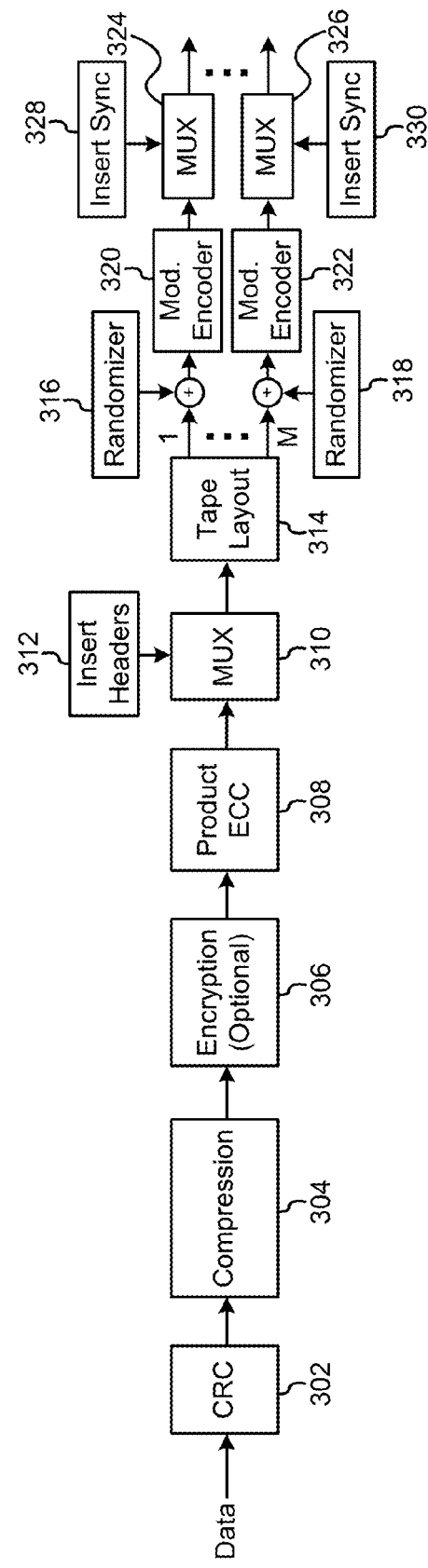
FIG. 3 shows a system for encoding data according to one embodiment.

Now referring to FIG. 3, a system 300 for encoding data in a tape drive with M simultaneously written tracks is shown, including the operations of a cyclic redundancy check (CRC) encoder 302, a compression module 304, an optional encryption module 306, a product error correction code (ECC) encoder module 308, a multiplexer 310 for adding one or more headers 312 to encoded data, and tape layout addition module 314, according to one embodiment. The system 300 also includes scrambling (e.g., randomizers 1 to M adapted for data randomization in each channel) 316, . . . , 318, modulation (Mod.) encoder modules 320, . . . , 322, which may utilize run-length limited (RLL) encoding, individual channel multiplexers 324, . . . , 326 for inserting synchronization information 328, . . . , 330 for each track 1, . . . , M. Any number of tracks may be written to a magnetic medium, such as 4 tracks, 8 tracks, 16 tracks, 32 tracks, 64 tracks, etc. Furthermore, any type of storage medium may be used, such as magnetic tape, optical disk (such as CD-ROM, DVD-ROM, Blu-Ray, etc.), hard disk, etc.

In one approach, the storage medium may be a magnetic tape, and the system 300 may comprise logic adapted for parsing the encoded data into a plurality of tracks prior to writing the encoded data to the magnetic tape, such as the tape layout addition module 314, in one embodiment.

In FIG. 3, the ECC encoder module 308 may be used for inserting a product code into sub data sets (SDS). In the following descriptions, most of these operations are not shown to simplify description as the C1 parity and C2 parity in the ECC encoding are the focus of the descriptions. However, any of the descriptions herein may include additional operations not depicted, but described in other figures. In FIG. 3, a forward concatenation architecture is shown where modulation encoding follows error correction coding. In the case of forward concatenation, modulation decoding precedes error correction decoding at the receiver. In various embodiments, the methods and systems described herein for improved decoding of product codes may be used in a forward concatenation setting or in a reverse concatenation setting where modulation encoding precedes error correction coding. In the case of reverse concatenation, modulation decoding follows error correction decoding at the receiver.

In product codes, every row and every column in a data array formed after encoding is a code word, regardless of the order in which the C1 encoding and the C2 encoding is applied. The distance of a product code is the product of the distances of its component codes, hence the name product code. Therefore, a 6×8 array of data which is first C1 encoded (with 6 byte row parity) will become a 6×14 row-encoded array, which after C2 encoding (with 4 byte column parity) will become a 10×14 encoded array (referred to as a [140,48,35] product code). Similarly, the same 6×8 array of data which is first C2 encoded (with 4 byte column parity) will become a 10×8 column-encoded array, which after C1 encoding (with 6 byte row parity) will become a 10×14 encoded array identical to that obtained from the C1/C2 encoding, i.e., a [140,48,35] product code.

A C1 code is a linear code which may be described as a [N1,K1,D1] code, where N1 is the codeword length (number of symbols), K1 is the data length (number of symbols), D1 is the minimum Hamming distance, with P1 being the parity length where P1=N1−K1 (number of symbols). The Hamming distance between two codewords is defined as the distance (amount of bytes) which are different between two codewords. A Reed-Solomon (RS) code may be described as a RS(N1,K1) code with a minimum Hamming distance of D1=N1−K1+1. The C1 code may be either the row code or the column code. Additionally, the parameter M1 may be selected such that M1<D1+1, in one embodiment.

A C2 code is another linear code which may be described as a [N2,K2,D2] code, where N2 is the codeword length (number of symbols), K2 is the data length (number of symbols), D2 is the minimum Hamming distance, with P2 being the parity length where P2=N2−K2 (number of symbols). The RS code may be described as a RS(N2,K2) code with a minimum Hamming distance of D2=N2−K2+1. The C2 code may be either the row code or the column code. Also, the parameter M2 may be selected such that M2<D2+1, in one embodiment.

In one embodiment, in order to improve error rate performance which may be achieved using iterative error-only decoding of product codes and iterative error-and-erasure decoding of product codes, an iterative decoding scheme is presented which utilizes a first decoding type followed by a second decoding type, with the first decoding type being different than the second decoding type. Any suitable decoding types known in the art may be used, such as error-only decoding, error-and-erasure decoding, Guruswami-Sudan list (GS) decoding, Welch-Berlekamp (WB) decoding, Sudan decoding, etc.

Information regarding GS decoding may be found in V. Guruswami and M. Sudan, "Improved Decoding of Reed-Solomon Codes and Algebraic Geometry Codes," *IEEE Trans. Inform. Theory*, vol. 45, no. 6, pp. 1757-1767, September 1999.

Information regarding WB decoding may be found in Welch et al., U.S. Pat. No. 4,633,470, issued Dec. 30, 1986, which is herein incorporated by reference.

Also, information regarding Sudan decoding may be found in M. Sudan, "Decoding of Reed-Solomon Codes beyond the Error-Correction Bound," *J. Complexity*, vol. 13, pp. 180-193, 1997.

By decoding a received row or a received column of a product codeword (up to two times or more per half iteration), rather than only once per half iteration as is typical of iterative schemes, more data is able to be recovered in each half iteration, thereby resulting in improved error rate performance. Specifically, error rates may be reduced by up to two orders in magnitude in comparison to typical iterative schemes.

In one particular embodiment, in each iteration, the row or column may be decoded a first time in each half iteration by error-only decoding and a second time by error-and-erasure decoding using information from a previous iteration. Various embodiments of this general scheme are possible including embodiments that account for a judicious use of limited decoding hardware resources.

Figure 4:
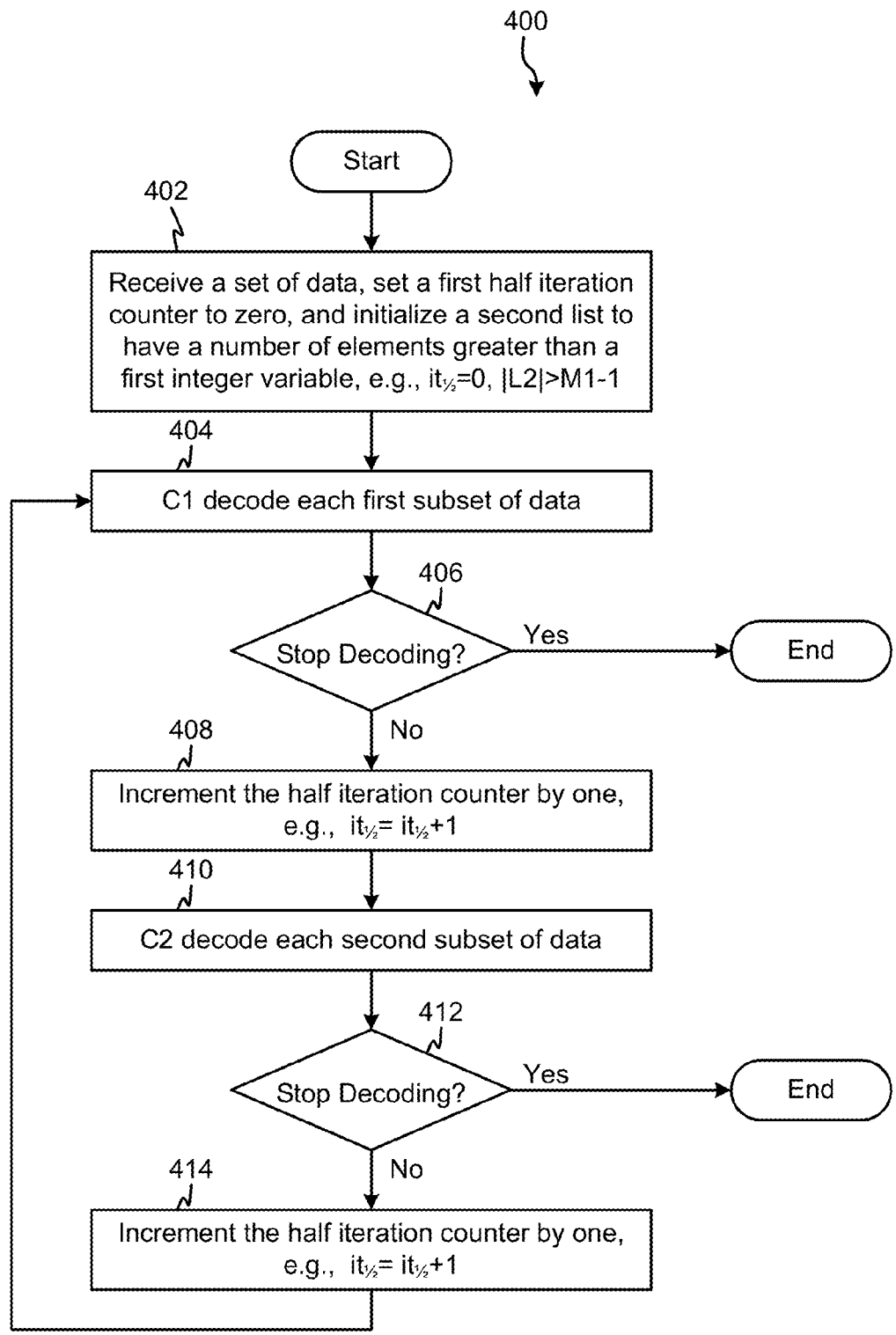
FIG. 4 shows a flowchart of a method for decoding data according to one embodiment.

Now referring to FIG. 4, a flowchart of a method 400 for decoding data is shown according to one embodiment. Method 400 may be executed in any desired environment, including those shown in FIGS. 1A-3, among others. Furthermore, more or less operations than those specifically described in FIG. 4 may be included in method 400.

In operation 402, a set of data is received, a first half iteration counter is set to zero ($it_{1/2}=0$), and a second list (L2) is received from a previous decoding attempt populated with information from that decoding attempt, or initialized so that a number of elements in the second list is greater than a first integer variable (M1) minus one, e.g., |L2|>M1−1. In this way, it is ensured that M1 is less than or equal to D1.

For each half iteration that is completed, the half iteration counter ($it_{1/2}$) will be incremented by one to track the completion of the half iteration. Therefore, a full iteration is reflected on the half iteration counter by 2. Any method for tracking which half iteration (and therefore which full iteration) has been completed may be used, as would be understood by one of skill in the art.

In a preferred embodiment, the set of data may be a data array, which includes encoded data of a data set, file, etc., in a structure in which the data may be manipulated, encoded, decoded, etc. A data array includes a plurality of rows and a plurality of columns, each row or column representing a subset of data. It does not matter whether the first subset of data is a row or column, as the encoding scheme used may be decoded from the rows first, and then the columns, or vice versa, while arriving at the same decoded array of data, due to the nature of the product codes used to encode/decode the data array.

In operation 404, each first subset of data is C1 decoded using any suitable C1-decoding scheme known in the art (and compatible with the code which was used to encode the data into the data array previously), to produce a C1-decoded set of data (as all first subsets of data are C1-decoded). When operation 404 is executed a first time, block 404 operates on each first subset of received data. When operation 404 is executed again (a second time, a third time, etc.), operation 404 is performed on each first subset of decoded data corresponding to the array obtained as a result of C2 decoding which is produced in operation 410.

Clearly, if a first subset of data (e.g., a row or a column) has already been successfully C1 decoded during a previous iteration and no symbol in this decoded first subset of data has been corrected (changed) during a subsequent C2 decoding, this first subset of data does not have to be decoded again because it is a permitted codeword (it has been successfully decoded before and not changed). Note that whenever a row or column is decoded successfully, the decoder produces a permitted codeword. However, it may still be a different permitted codeword than an original codeword because too many errors happened. This case is known as miscorrection. This results in three possible cases: 1) correct successful decoding; 2) decoding failure (decoder leaves the erroneous codeword unchanged and indicates that it is unable to correct the codeword); and 3) miscorrection (decoder produces a permitted codeword but not the correct original codeword).

Figure 5:
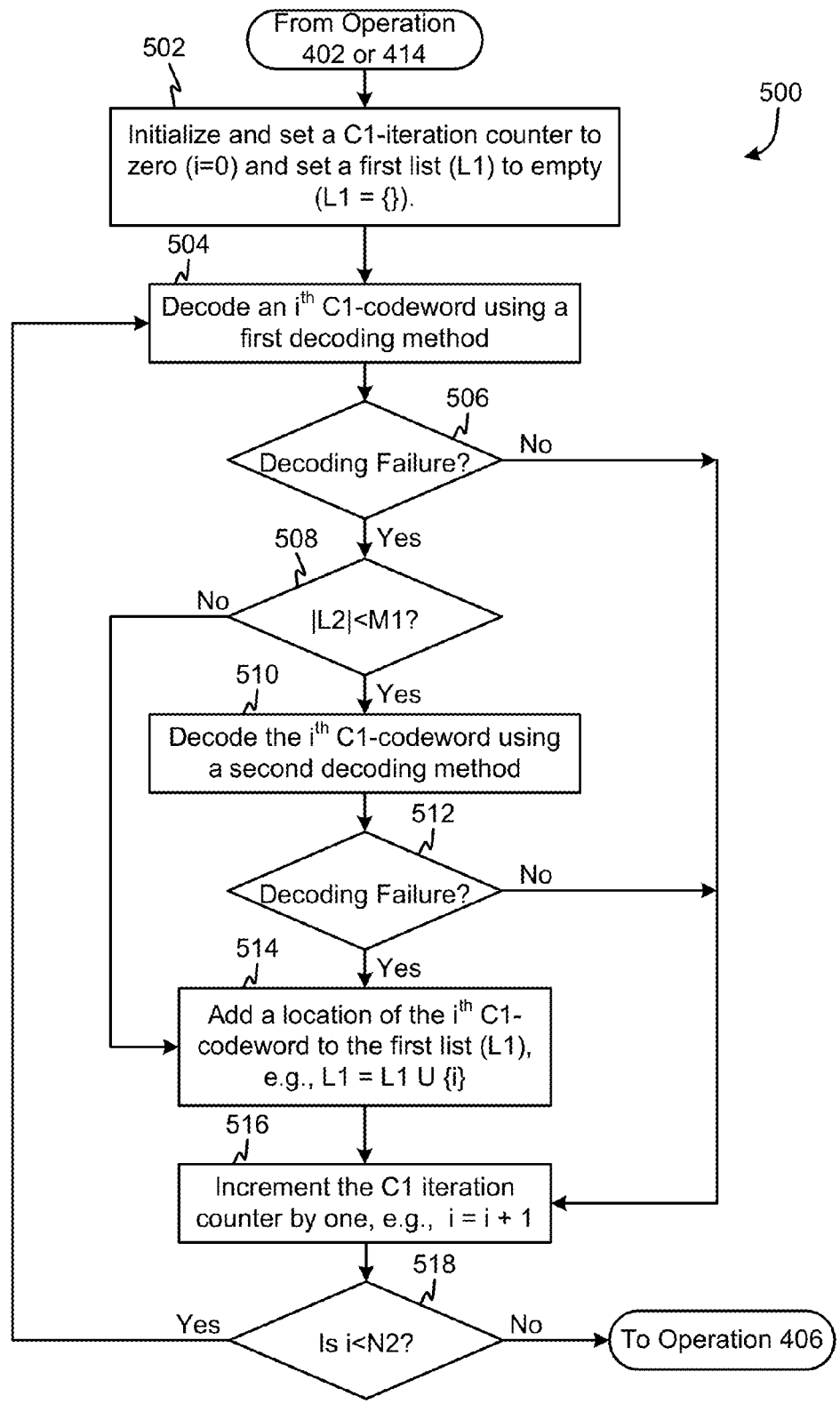
FIG. 5 shows a flowchart of a method for decoding data according to one embodiment.

According to one embodiment, operation 404 may include the functionality of some or all of the operations in FIG. 5, which depicts a C1-decoding method 500, according to one embodiment.

Figure 7:
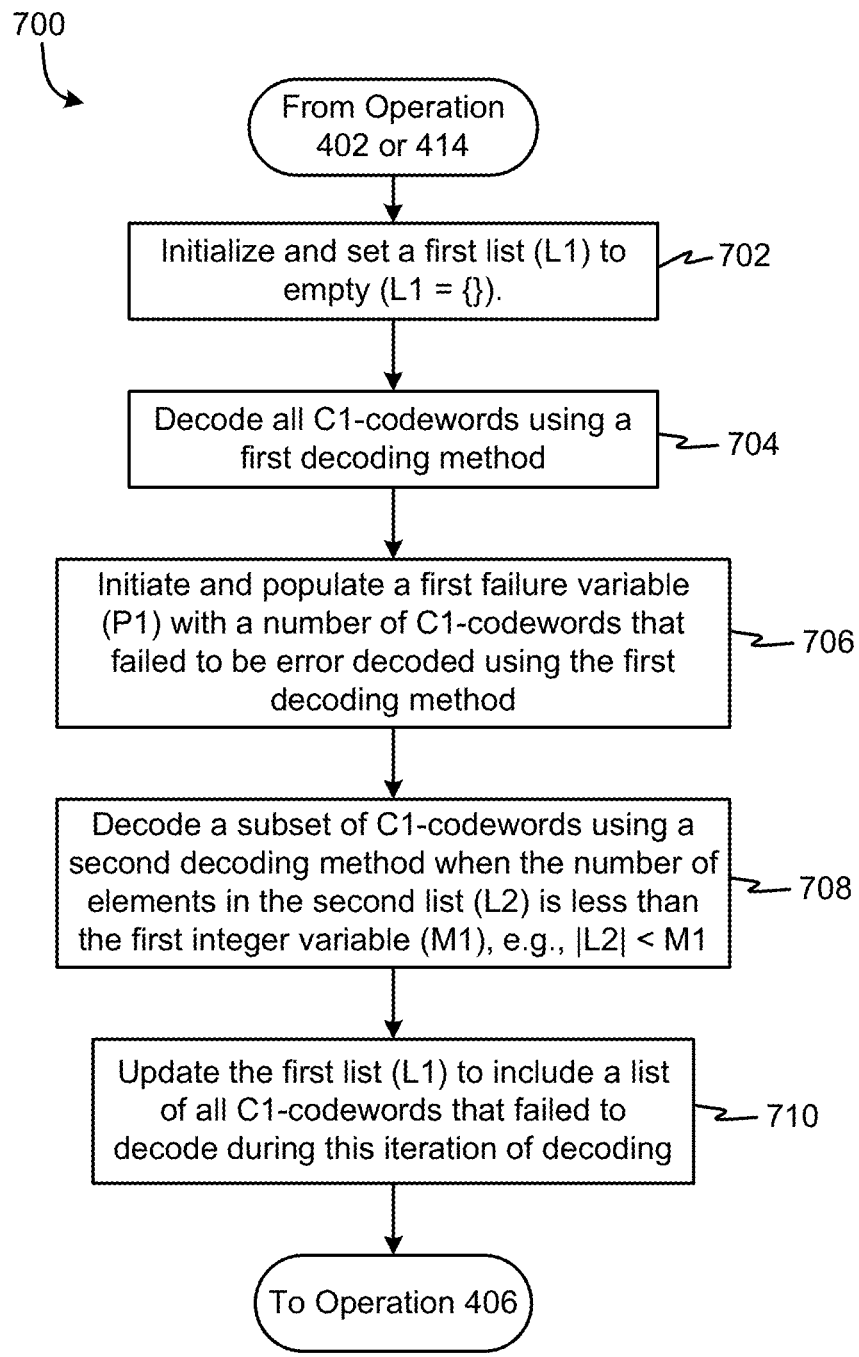
FIG. 7 shows a flowchart of a method for decoding data according to one embodiment.

In another embodiment, operation 404 may include the functionality of some or all of the operations of FIG. 7, which depicts a C1-decoding method 700, according to one embodiment.

Referring again to FIG. 4, in operation 406, it is determined whether to continue decoding the set of data. When it is decided to stop decoding the data set, method 400 ends and results of the C1 decoding, such as the decoded set of data is output, stored, passed to another module, etc. When it is decided to continue decoding, method 400 continues to operation 408.

In one embodiment, the decision to continue decoding may be based on a number of errors that remain in each of the C1-decoded subsets of the set of data (such as in C1-decoded rows or columns of the data array), along with a known number of correctable errors that may be corrected in each of the first subsets of data, based on the encoding/decoding schemes being used in this particular set of data.

In another embodiment, the decision to continue decoding may be based on determining whether all C1-decoded subsets of the set of data are permitted C1-codewords, and whether all C2-decoded subsets of the set of data are permitted C2-codewords.

For example, when C1-codewords are rows of a data array, and C2-codewords are columns of the data array, the decision to continue decoding may be based on whether all decoded rows are permitted row codewords and all decoded columns are permitted column codewords (by permitted, what is meant is that each codeword is valid and data within each codeword is able to be successfully decoded). This decision may be made after a row or column is decoded using one of the decoding methods.

In this embodiment, when no more than a correctable number of errors remain in each of the C1-decoded subsets of data after C1-decoding, method 400 ends, the remaining errors are corrected, and the C1-decoded set of data is output, stored, passed to another module, etc. When more than a correctable number of errors remain in one or more of the C1-decoded subsets of data, method 400 continues to operation 408.

Specifically, when the first subsets of data are rows in the data array, it is known how many errors may be corrected in each row based on the encoding/decoding schemes being used. Therefore, as long as no more errors than the known number of correctable errors are present in each row of the data array, then all errors in the rows of the data array may be corrected, and therefore no more decoding is necessary. In other words, when the first subsets of data are rows in the data array, when all rows may be successfully C1-decoded, method 400 ends and the decoded data array is output.

Similarly, when the first subsets of data are columns in the data array, it is known how many errors may be corrected in each column based on the encoding/decoding schemes being used. Therefore, as long as no more errors than the known number of correctable errors are present in each column of the data array, then all errors in the columns of the data array may be corrected, and therefore no more decoding is necessary. In other words, when the first subsets of data are columns in the data array, when all columns may be successfully C1 decoded, method 400 ends and the decoded data array is output.

In operation 408, the half iteration counter ($it_{1/2}$) is incremented by one ($it_{1/2}=it_{1/2}+1$) indicating execution of one half iteration. Any method for tracking which half iteration (and therefore which full iteration) has been completed may be used, as would be understood by one of skill in the art. In implementation, the current half iteration is tracked, regardless of the method used to track the half and/or full iterations.

In operation 410, each second subset of the set of data is C2 decoded using any suitable C2-decoding scheme known in the art (and compatible with the code which was used to encode the data into the data array previously), to produce a C2-decoded set of data (as all second subsets of data are C2-decoded). When operation 410 is executed, operation 410 is performed on each second subset of decoded data corresponding to the array obtained as a result of C1 decoding performed in operation 404.

Clearly, if a second subset of data (e.g., a row or a column) has already been successfully C2 decoded during a previous iteration and no symbol in this decoded second subset of data has been corrected (changed) during a subsequent C1 decoding, this second subset of data does not have to be decoded again because it is a permitted codeword (it has been successfully decoded before and not changed). Note that whenever a row or column is decoded successfully, the decoder produces a permitted codeword. However, it may still be a different permitted codeword than an original codeword because too many errors happened. This case is known as miscorrection. This results in three possible cases: 1) correct successful decoding; 2) decoding failure (decoder leaves the erroneous codeword unchanged and indicates that it is unable to correct the codeword); and 3) miscorrection (decoder produces a permitted codeword but not the correct original codeword).

Figure 6:
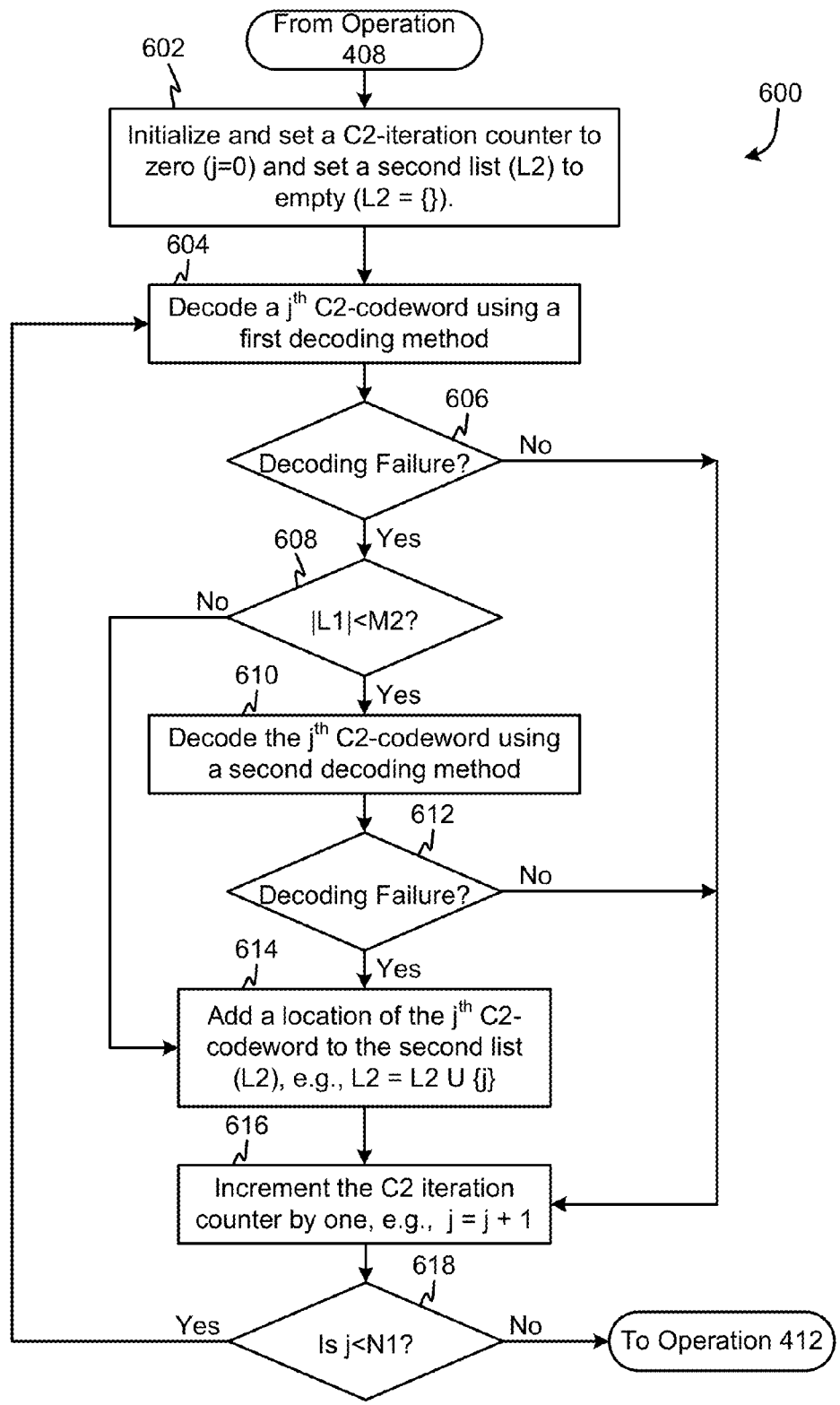
FIG. 6 shows a flowchart of a method for decoding data according to one embodiment.

According to one embodiment, operation 410 may include the functionality of some or all of the operations of FIG. 6, which depicts a C2-decoding method 600, according to one embodiment.

Figure 8:
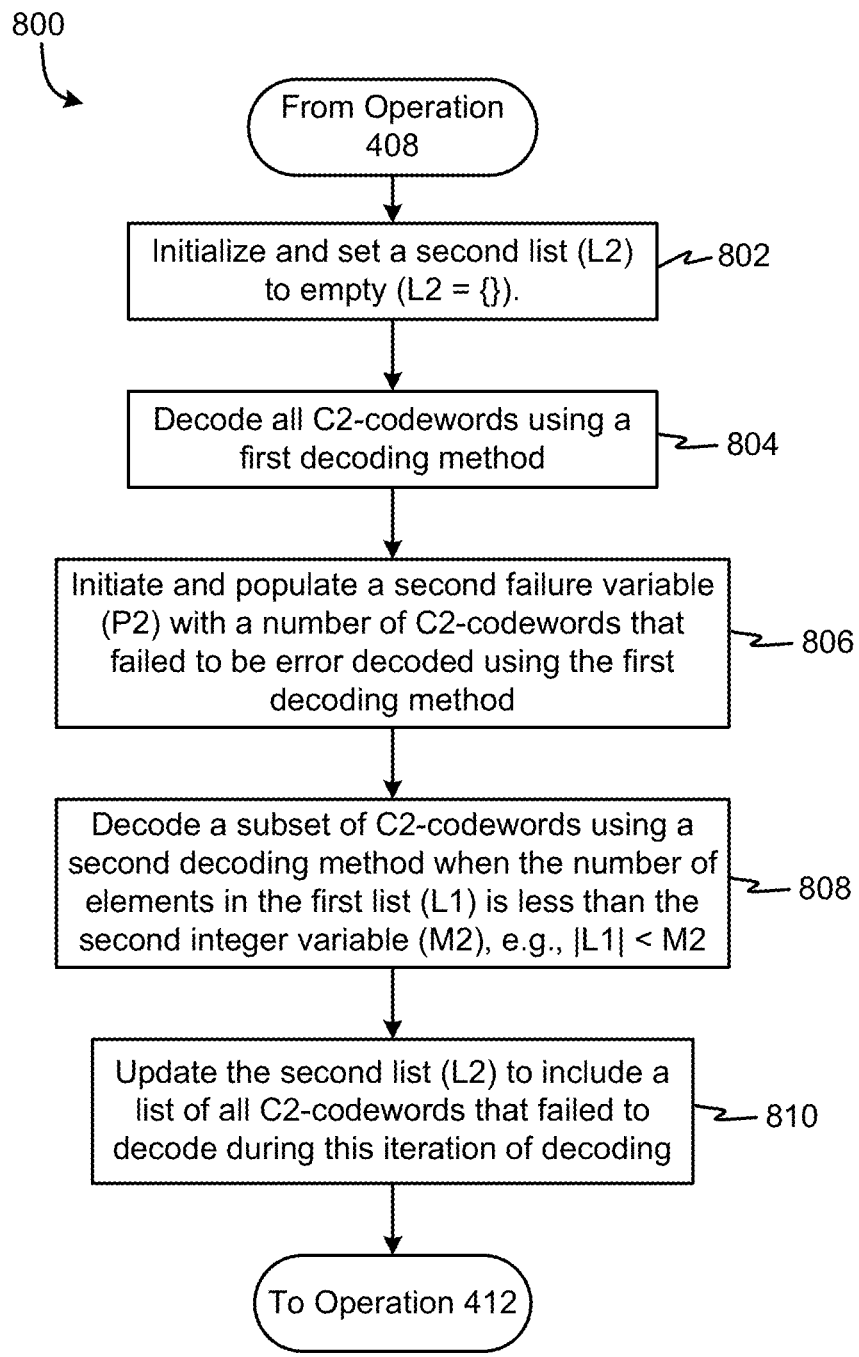
FIG. 8 shows a flowchart of a method for decoding data according to one embodiment.

In another embodiment, operation 410 may include the functionality of some or all of the operations of FIG. 8, which depicts a C2-decoding method 800, according to another embodiment.

Referring again to FIG. 4, in operation 412, it is determined whether to continue decoding the set of data. When it is decided to stop decoding, method 400 ends and results of the C2 decoding, such as the decoded set of data is output, stored, passed to another module, etc. When it is decided to continue decoding, method 400 continues to operation 414.

In one embodiment, the decision to continue decoding may be based on a number of errors that remain in each of the C2-decoded subsets of data (such as in each C2-decoded row or column of the data array), along with a known number of correctable errors that may be corrected in each second subset of data, based on the encoding/decoding schemes being used in this particular set of data.

In this embodiment, when no more than a correctable number of errors remain in each of the C2-decoded subsets of data after C2-decoding, method 400 ends, the remaining errors are corrected, and the decoded set of data is output, stored, passed to another module, etc. When more than a correctable number of errors remain in one or more of the C2-decoded subsets of data, method 400 continues to operation 414.

Specifically, when the second subsets of data are rows in the data array (so that the first subsets of data are columns), it is known how many errors may be corrected in each row based on the encoding/decoding schemes being used. Therefore, as long as no more errors than the known number of correctable errors are present in each row of the data array, then all errors in the rows of the data array may be corrected, and therefore no more decoding is necessary. In other words, when the second subsets of data are rows in the data array, when all rows may be successfully C2 decoded, method 400 ends and the decoded data array is output.

Similarly, when the second subsets of data are columns in the data array (so that the first subsets of data are rows), it is known how many errors may be corrected in each column based on the encoding/decoding schemes being used. Therefore, as long as no more errors than the known number of correctable errors are present in each column of the data array, then all errors in the columns of the data array may be corrected, and therefore no more decoding is necessary. In other words, when the second subsets of data are columns in the data array, when all columns may be successfully C2 decoded, method 400 ends and the C2-decoded data array is output.

In operation 414, the half iteration counter ($it_{1/2}$) is incremented by one ($it_{1/2}=it_{1/2}+1$) indicating execution of another half iteration. In method 400, the half iteration counter ($it_{1/2}$) now indicates a value of 2, as two half iterations have been completed. Method 400 then returns to operation 404 to perform another iteration of C1-decoding on the set of data.

Any method for tracking which half iteration (and therefore which full iteration) has been completed may be used, as would be understood by one of skill in the art. In implementation, the current half iteration is tracked, regardless of the method used to track the half and/or full iterations.

In one embodiment, method 400 along with the C1-decoding and C2-decoding methods depicted in FIGS. 5-6 may be utilized for systems where an optimum error rate is preferred, regardless of the cost in terms of resources.

In another embodiment, method 400 in FIG. 4 along with the C1-decoding and C2-decoding methods depicted in FIGS. 7-8 may be utilized for systems where limited resources are available, but improved error rate performance is desired.

Now referring to FIG. 5, a flowchart of a method 500 for C1 decoding data is shown according to one embodiment. Method 500 may be executed in any desired environment, including those shown in FIGS. 1A-4, among others. Furthermore, more or less operations than those specifically described in FIG. 5 may be included in method 500.

In operation 502, a C1-iteration counter (i) is initialized and set to zero (i=0) and a first list (L1) is set to empty (L1={ }). Any method of tracking a number of iterations used in C1-decoding method 500 may be used, as would be apparent to one of skill in the art.

In one embodiment, the first list (L1) may be used to store the list of rows and/or columns of the data array which fail to decode.

In operation 504, an $i^{th}$ C1-codeword is decoded using a first decoding method. The first decoding method may be any decoding method known in the art to be compatible with C1 codes, such as error-only decoding, error-and-erasure decoding, GS decoding, etc.

When any type of decoding is used where erasures are made, the locations of these erasures are stored in the second list (L2) for the $i^{th}$ codeword. In this way, the second list (L2) may be used to store the list of locations in rows and/or columns of the data array which have been erased.

In operation 506, it is determined whether the first decoding of the $i^{th}$ C1-codeword failed. When the first decoding of the $i^{th}$ C1-codeword fails, method 500 continues to operation 508; otherwise, method 500 jumps to operation 516.

Any method of detecting failure known in the art may be used, such as determining that one or more errors remain in the C1-codeword after first C1-decoding thereof, that more than a correctable number of errors remain in the C1-codeword prior to attempting to correct errors, etc.

In operation 508, it is determined whether the number of elements in the second list (L2) is less than the first integer variable (M1), e.g., $|L2|<M1$. When the number of elements in the second list (L2) is less than the first integer variable (M1), method 500 continues to operation 510; otherwise, method 500 jumps to operation 514.

In operation 510, the $i^{th}$ C1-codeword is decoded using a second decoding method. The second decoding method may be any decoding method different from the first decoding method that is known in the art to be compatible with C1 codes, such as error-only decoding, error-and-erasure decoding, GS decoding, WB decoding, etc.

For example, when the first decoding method is error-only decoding, the second decoding method may be error-and-erasure decoding, WB decoding, Sudan decoding, etc. Conversely, when the first decoding method is error-and-erasure decoding, the second decoding method may be error-only decoding, GS decoding, etc.

When any type of decoding is used where erasures are made, the location of these erasures are stored in the second list (L2) for the $i^{th}$ codeword.

In operation 512, it is determined whether the second decoding of the $i^{th}$ C1-codeword failed. When the second decoding of the $i^{th}$ C1-codeword fails, method 500 continues to operation 514; otherwise, method 500 jumps to operation 516.

Any method of detecting failure known in the art may be used, such as determining that one or more errors remain in the C1-codeword after second C1-decoding thereof, that more than a correctable number of errors remain in the C1-codeword prior to attempting to correct errors, etc.

In operation 514, the first list (L1) has a location of the $i^{th}$ C1-codeword added thereto, e.g., $L1=L1\cup\{i\}$. In this way, the location of each C1-codeword which fails to decode successfully will be saved to the first list for use in later decoding attempts.

In operation 516, the C1-iteration counter (i) is incremented by one (i=i+1) indicating execution of a C1 iteration.

Any method for tracking how many C1 iterations have been completed may be used, as would be understood by one of skill in the art. In implementation, the current C1 iteration is tracked, regardless of the method used to track the C1 iterations.

In operation 518, it is determined whether the C1-iteration counter (i) is less than a number of C1-codewords (N2), e.g., i<N2. In this way, it is ensured that all C1-codewords are decoded two times (or more, in some embodiments), when not decoded successfully in a single decoding step. When the C1-iteration counter is less than the number of C1-codewords, method 500 returns to operation 504 to decode a next C1-codeword; otherwise, method 500 continues to operation 406.

In some embodiments, method 500 may be repeated one or more times in order to attempt to successfully decode each C1-codeword when all C1-codewords are not able to be decoded successfully after two decoding methods in operations 504 and 510.

Now referring to FIG. 6, a flowchart of a method 600 for C2 decoding data is shown according to one embodiment. Method 600 may be executed in any desired environment, including those shown in FIGS. 1A-4, among others. Furthermore, more or less operations than those specifically described in FIG. 6 may be included in method 600.

In operation 602, a C2-iteration counter (j) is initialized and set to zero (j=0) and a second list (L2) is set to empty (L2={ }). Any method of tracking a number of iterations used in C2-decoding method 600 may be used, as would be apparent to one of skill in the art.

In one embodiment, the second list (L2) may be used to store the list of rows and/or columns of the data array which fail to decode.

In operation 604, a $j^{th}$ C2-codeword is decoded using a first decoding method. The first decoding method may be any decoding method known in the art to be compatible with C2 codes, such as error-only decoding, error-and-erasure decoding, GS decoding, etc.

When any type of decoding is used where erasures are made, the locations of these erasures are stored in the first list (L1) for the $j^{th}$ codeword. In this way, the first list (L1) may be used to store the list of locations in rows and/or columns of the data array which have been erased.

In operation 606, it is determined whether the first decoding of the $j^{th}$ C2-codeword failed. When the first decoding of the $j^{th}$ C2-codeword fails, method 600 continues to operation 608; otherwise, method 600 jumps to operation 616.

Any method of detecting failure known in the art may be used, such as determining that one or more errors remain in the C2-codeword after first C2-decoding thereof, that more than a correctable number of errors remain in the C2-codeword prior to attempting to correct errors, etc.

In operation 608, it is determined whether the number of elements in the first list (L1) is less than the second integer variable (M2), e.g., |L1|<M2. When the number of elements in the first list (L1) is less than the second integer variable (M2), method 600 continues to operation 610; otherwise, method 600 jumps to operation 614.

In operation 610, the $j^{th}$ C2-codeword is decoded using a second decoding method. The second decoding method may be any decoding method different from the first decoding method that is known in the art to be compatible with C2 codes, such as error-only decoding, error-and-erasure decoding, GS decoding, WB decoding, etc.

For example, when the first decoding method is error-only decoding, the second decoding method may be error-and-erasure decoding, WB decoding, Sudan decoding, etc. Conversely, when the first decoding method is error-and-erasure decoding, the second decoding method may be error-only decoding, GS decoding, etc.

When any type of decoding is used where erasures are made, the location of these erasures are stored in the first list (L1) for the $j^{th}$ codeword.

In operation 612, it is determined whether the second decoding of the $j^{th}$ C2-codeword failed. When the second decoding of the $j^{th}$ C2-codeword fails, method 600 continues to operation 614; otherwise, method 600 jumps to operation 616.

Any method of detecting failure known in the art may be used, such as determining that one or more errors remain in the C2-codeword after second C2-decoding thereof, that more than a correctable number of errors remain in the C2-codeword prior to attempting to correct errors, etc.

In operation 614, the second list (L2) has a location of the $j^{th}$ C2-codeword added thereto, e.g., L2=L2∪{j}. In this way, the location of each C2-codeword which fails to decode successfully will be saved to the second list for use in later decoding attempts.

In operation 616, the C2-iteration counter (j) is incremented by one (j=j+1) indicating execution of a C2 iteration. Any method for tracking how many C2 iterations have been completed may be used, as would be understood by one of skill in the art. In implementation, the current C2 iteration is tracked, regardless of the method used to track the C2 iterations.

In operation 618, it is determined whether the C2-iteration counter (j) is less than a number of C2-codewords (N1), e.g., j<N1. In this way, it is ensured that all C2-codewords are decoded two times (or more, in some embodiments), when not decoded successfully in a single decoding step. When the C2-iteration counter is less than the number of C2-codewords, method 600 returns to operation 604 to decode a next C2-codeword; otherwise, method 600 continues to operation 406.

In some embodiments, method 600 may be repeated one or more times in order to attempt to successfully decode each C2-codeword when all C2-codewords are not able to be decoded successfully after two decoding methods in operations 604 and 610.

Now referring to FIG. 7, a flowchart of a method 700 for C1 decoding data is shown according to one embodiment. Method 700 may be executed in any desired environment, including those shown in FIGS. 1A-4, among others. Furthermore, more or less operations than those specifically described in FIG. 7 may be included in method 700.

In operation 702, a first list (L1) is set to empty (L1={ }). In one embodiment, the first list (L1) may be used to store the list of rows and/or columns of the data array which fail to decode.

In operation 704, all C1-codewords are decoded using a first decoding method. The first decoding method may be any decoding method known in the art to be compatible with C1 codes, such as error-only decoding, error-and-erasure decoding, GS decoding, etc.

In operation 706, a first failure variable (P1) is initiated and populated with a number of C1-codewords that failed to be error decoded using the first decoding method. For example, when three C1-codewords fail to be error decoded, P1=3.

In operation 708, a second decoding method is used to decode a subset (E1) of P1 codewords with erasure locations as stored in L2 when the number of elements in the second list (L2) is less than the first integer variable (M1), e.g., |L2|<M1.

In operation 710, the first list (L1) is updated to include a list of all C1-codewords that failed to decode during this iteration of decoding.

In one embodiment, the first decoding method may be error-only decoding while the second decoding method may be error-and-erasure decoding, and the C1-codewords which were unable to be decoded with error-only decoding are marked so that in error-and-erasure decoding, these C1-codewords may be decoded with erasures.

Now referring to FIG. 8, a flowchart of a method 800 for C2 decoding data is shown according to one embodiment. Method 800 may be executed in any desired environment, including those shown in FIGS. 1A-4, among others. Furthermore, more or less operations than those specifically described in FIG. 8 may be included in method 800.

In operation 802, a second list (L2) is set to empty (L2={ }). In one embodiment, the second list (L2) may be used to store the list of rows and/or columns of the data array which fail to decode.

In operation 804, all C2-codewords are decoded using a first decoding method. The first decoding method may be any decoding method known in the art to be compatible with C2 codes, such as error-only decoding, error-and-erasure decoding, GS decoding, etc.

In operation 806, a second failure variable (P2) is initiated and populated with a number of C2-codewords that failed to be error decoded using the first decoding method. For example, when five C2-codewords fail to be error decoded, P2=5.

In operation 808, a second decoding method is used to decode a subset (E2) of P2 codewords with erasure locations as stored in L1 when the number of elements in the first list (L1) is less than the second integer variable (M2), e.g., |L1|<M2.

In operation 810, the second list (L2) is updated to include a list of all C2-codewords that failed to decode during this iteration of decoding.

In one embodiment, the first decoding method may be error-only decoding while the second decoding method may be error-and-erasure decoding, and the C2-codewords which were unable to be decoded with error-only decoding are marked so that in error-and-erasure decoding, these C2-codewords may be decoded with erasures.

Figure 9:
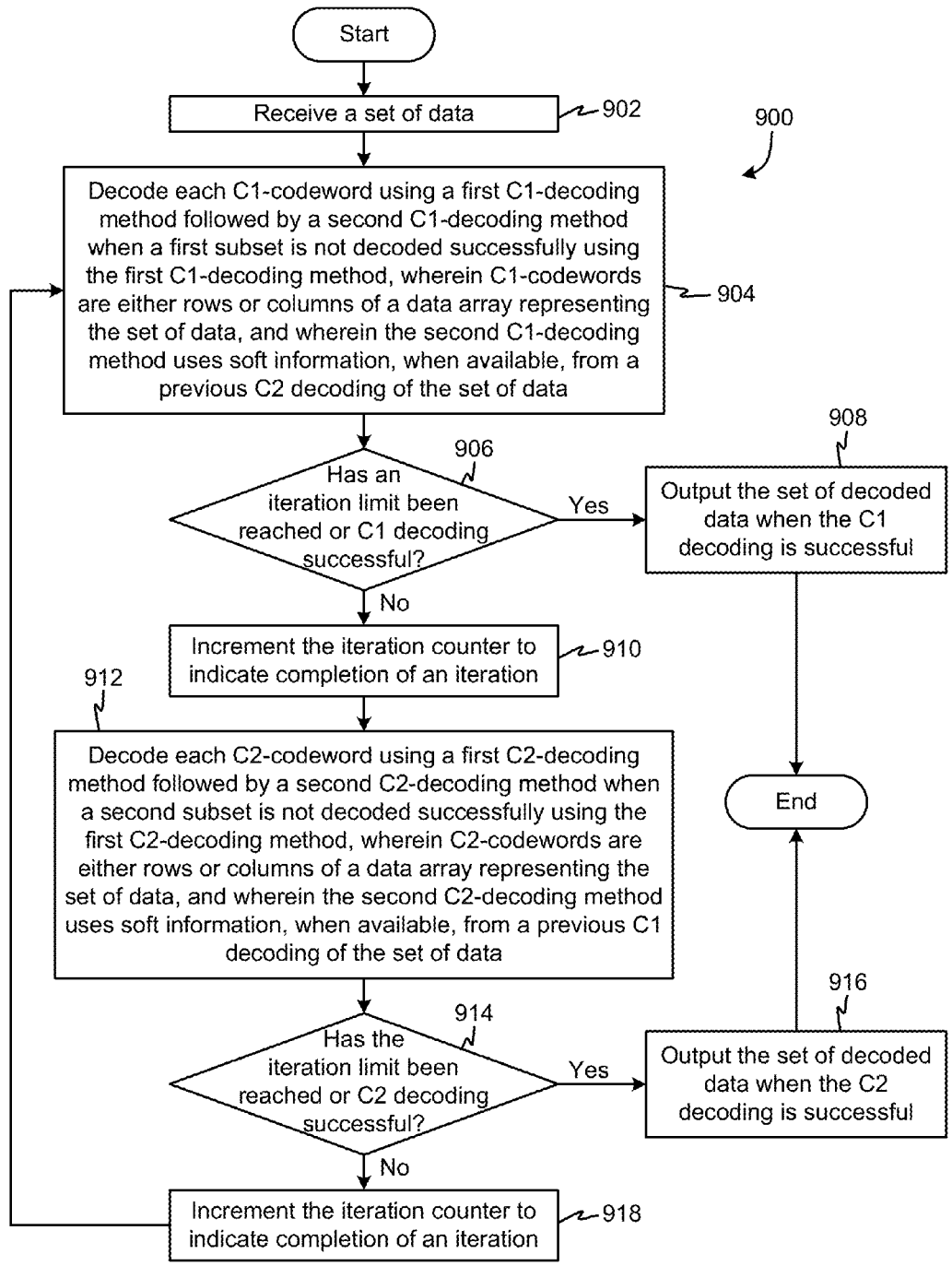
FIG. 9 shows a flowchart of a method for decoding data according to one embodiment.

Now referring to FIG. 9, a flowchart of a method 900 for decoding data is shown according to one embodiment. Method 900 may be executed in any desired environment, including those shown in FIGS. 1A-4, among others. Furthermore, more or less operations than those specifically described in FIG. 9 may be included in method 900.

In operation 902, a set of data is received. The set of data may be represented by a data array having rows and columns, with each row being a codeword that may include erroneous symbols and each column being a codeword that may include erroneous symbols. At the output of the encoder, each row is a codeword and each column is a codeword. During transmission or storage, symbol errors may occur and therefore at the receiver, rows and columns may not be permitted codewords because they include erroneous symbols. A purpose of the decoder is to correct these errors.

Operations 904-918 are repeated in an iterative process until a set of decoded data is output or a predetermined number of iterations have occurred. The predetermined number of iterations may be any whole number from 1 to 10, according to various embodiments, with a preferred number of iterations totaling 2 or less.

Furthermore, C1 decoding and C2 decoding are performed on the set of data as modified by any previous decoding attempts, and the only time that the received set of data is processed is in the first C1 decoding attempt in operation 904.

In operation 904, each C1-codeword of the set of data is C1 decoded using a first C1-decoding method followed by a second C1-decoding method different from the first C1-decoding method when a first subset is not decoded successfully using the first C1-decoding method. In this way, each C1-codeword is decoded once in one way, and then again in another way, providing increased chances of decoding the codeword successfully. The C1-codewords are either rows or columns of a data array representing the set of data, and the second C1-decoding method uses soft information, when available, from a previous C2 decoding of the set of data (e.g., C2 decoding has been performed on the set of data and this is not the first iteration of the method 900).

In operation 906, it is determined whether an iteration limit has been reached or a set of decoded data has been produced after the C1 decoding. When either of these conditions are satisfied, method 900 ends.

In operation 908, the set of decoded data is output, stored, transferred, copied, etc., when the C1 decoding is successful. This produces a set of decoded data, and method 900 is no longer needed to execute, and therefore ends.

In operation 910, an iteration counter is incremented to indicate completion of an iteration when the C1 decoding is not successful and method 900 continues.

In operation 912, each C2-codeword of the set of data is C2 decoded using a first C2-decoding method followed by a second C2-decoding method different from the first C2-decoding method when a second subset is not decoded successfully using the first C2-decoding method. The second C2-decoding method uses soft information from a previous C1 decoding of the set of data, such as in operation 904. The C2-codewords are either rows or columns of the data array representing the set of data different from the C1-codewords (e.g., when the C1-codewords are rows, the C2-codewords are columns, and vice versa).

In operation 914, it is determined whether the iteration limit has been reached or the set of decoded data has been produced after the C2 decoding. When either of these conditions are satisfied, method 900 ends.

In operation 916, the set of decoded data is output, stored, transferred, copied, etc., when the C2 decoding is successful. This produces a set of decoded data, and method 900 is no longer needed to execute, and therefore ends.

In operation 918, the iteration counter is incremented to indicate completion of an iteration when the C2 decoding is not successful and method 900 continues by returning to operation 904.

In one embodiment, the first C1-decoding method and the first C2-decoding method may comprise error-only decoding. Furthermore, the second C1-decoding method and the second C2-decoding method may comprise error-and-erasure decoding.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
    a processor; and
    logic integrated with and/or executable by the processor, wherein the logic is configured to cause the processor to:
        receive a set of data; and
        in an iterative process until a set of decoded data is output or a predetermined number of full iterations have occurred:
            C1 decode all first subsets of the set of data;
            determine whether to stop decoding the set of data after the C1 decoding;
            increment a half iteration counter to indicate completion of a half iteration;
            C2 decode all second subsets of the set of data two or more times in each half iteration using two or more C2-decoding methods in response to a determination that a second subset is not decoded successfully using a first C2-decoding method;
            determine whether to stop decoding the set of data after the C2 decoding;
            increment the half iteration counter to indicate completion of another half iteration; and
            output the set of decoded data in response to a determination that all subsets of the set of data are decoded successfully,
            wherein C1 decoding and C2 decoding are performed on the set of data as modified by any previous decoding attempts.

2. The system as recited in claim 1, wherein the logic configured to cause the processor to determine whether to stop decoding the set of data after the C1 decoding is further configured to cause the processor to:
    determine a number of remaining errors in each of the first subsets of data;
    continue decoding in response to a determination that the number of remaining errors in one or more of the first subsets of data exceeds a number of correctable errors; and
    stop decoding in response to a determination that the number of remaining errors in each of the first subsets of data is less than or equal to the number of correctable errors; and
    wherein the logic configured to cause the processor to determine whether to stop decoding the set of data after the C2 decoding is further configured to cause the processor to:
        determine a number of remaining errors in each of the second subsets of data;
        continue decoding when the number of remaining errors in one or more of the second subsets of data exceeds a number of correctable errors; and
        stop decoding when the number of remaining errors in each of the second subsets of data is less than or equal to the number of correctable errors.

3. The system as recited in claim 1, wherein the logic configured to cause the processor to C1 decode all first subsets of the set of data is further configured to cause the processor to:
    set a C1 iteration counter to zero and empty a first list; and
    in an iterative process until the set of decoded data is output or a predetermined number of allowed C1 iterations have occurred:
        decode a C1-codeword using a first C1-decoding method;
        determine whether to stop decoding the C1-codeword based on a number of errors remaining in the C1-codeword after first decoding thereof;
        determine whether a number of elements in a second list is less than a first integer variable, the first integer variable being set to at least two;
        decode the C1-codeword using a second C1-decoding method in response to a determination that the number of elements in the second list is less than the first integer variable;
        determine whether the second decoding of the C1-codeword failed;
        add a location of the C1-codeword to the first list when the second decoding of the C1-codeword failed;
        increment the C1 iteration counter to indicate completion of a C1 iteration; and
        stop C1 decoding in response to a determination that the C1 iteration counter is greater than or equal to the predetermined number of allowed C1 iterations.

4. The system as recited in claim 1, wherein the logic configured to cause the processor to C2 decode all second subsets of the set of data is further configured to cause the processor to:
    set a C2 iteration counter to zero and empty a second list; and
    in an iterative process until the set of decoded data is output or a predetermined number of allowed C2 iterations have occurred:
        decode a C2-codeword using the first C2-decoding method;
        determine whether to stop decoding the C2-codeword based on a number of errors remaining in the C2-codeword after first decoding thereof;
        determine whether a number of elements in a first list is less than a second integer variable, the second integer variable being set to at least two;
        decode the C2-codeword using a second C2-decoding method in response to a determination that the number of elements in the first list is less than the second integer variable;
        determine whether the second decoding of the C2-codeword failed;
        add a location of the C2-codeword to the second list when the second decoding of the C2-codeword failed;
        increment the C2 iteration counter to indicate completion of a C2 iteration; and
        stop C2 decoding in response to a determination that the C2 iteration counter is greater than or equal to the predetermined number of allowed C2 iterations.

5. The system as recited in claim 1, wherein the set of data is arranged in a data array having rows and columns, wherein the first subset of data is either the rows or the columns of the data array, wherein the second subset of data is the rows when the first subset is the columns, and wherein the second subset of data is the columns when the first subset is the rows.

6. The system as recited in claim 1, wherein the logic configured to cause the processor to C1 decode all first subsets of the set of data is further configured to cause the processor to:
set a first list to empty;
decode all C1-codewords using a first C1-decoding method;
set a first failure variable as a number of C1-codewords which failed to decode successfully;
decode a subset of C1-codewords using a second C1-decoding method with erasure locations indicated in a second list, the subset of C1-codewords including all those C1-codewords which failed to C1 decode successfully in response to a determination that a number of elements in the second list is less than a first integer variable; and
update the first list to include all C1-codewords which failed to successfully decode,
wherein the first C1-decoding method is error-only decoding and the second C1-decoding method is error-and-erasure decoding.

7. The system as recited in claim 6, wherein the logic configured to cause the processor to C2 decode all second subsets of the set of data is further configured to cause the processor to:
set the second list to empty;
decode all C2-codewords using the first C2-decoding method;
set a second failure variable as a number of C2-codewords which failed to decode successfully;
decode a subset of C2-codewords using a second C2-decoding method with erasure locations indicated in the first list, the subset of C2-codewords including all those C2-codewords which failed to C2 decode successfully in response to a determination that a number of elements in the first list is less than a second integer variable; and
update the second list to include all C2-codewords which failed to successfully decode,
wherein the first C2-decoding method is error-only decoding and the second C2-decoding method is error-and-erasure decoding.

8. A method, comprising:
receiving a set of data; and
in an iterative process until a set of decoded data is output or a predetermined number of full iterations have occurred:
C1 decoding all first subsets of the set of data;
determining whether to stop decoding the set of data after the C1 decoding;
incrementing a half iteration counter to indicate completion of a half iteration;
C2 decoding all second subsets of the set of data two or more times in each half iteration using two or more C2-decoding methods in response to a determination that a second subset is not decoded successfully using a first C2-decoding method;
determining whether to stop decoding the set of data after the C2 decoding;
incrementing the half iteration counter to indicate completion of another half iteration; and
outputting the set of decoded data in response to a determination that all subsets of the set of data are decoded successfully,
wherein C1 decoding and C2 decoding are performed on the set of data as modified by any previous decoding attempts.

9. The method as recited in claim 8, wherein the determining whether to stop decoding the set of data after the C1 decoding is further comprises:
determine a number of remaining errors in each of the first subsets of data;
continue decoding in response to a determination that the number of remaining errors in one or more of the first subsets of data exceeds a number of correctable errors; and
stop decoding in response to a determination that the number of remaining errors in each of the first subsets of data is less than or equal to the number of correctable errors; and
wherein the determining whether to stop decoding the set of data after the C2 decoding further comprises:
determine a number of remaining errors in each of the second subsets of data;
continue decoding in response to a determination that the number of remaining errors in one or more of the second subsets of data exceeds a number of correctable errors; and
stop decoding in response to a determination that the number of remaining errors in each of the second subsets of data is less than or equal to the number of correctable errors.

10. The method as recited in claim 8, wherein the C1 decoding all first subsets of the set of data further comprises:
setting a C1 iteration counter to zero and empty a first list; and
in an iterative process until the set of decoded data is output or a predetermined number of allowed C1 iterations have occurred:
decoding a C1-codeword using a first C1-decoding method;
determining whether to stop decoding the C1-codeword based on a number of errors remaining in the C1-codeword after first decoding thereof;
determining whether a number of elements in a second list is less than a first integer variable, the first integer variable being set to at least two;
decoding the C1-codeword using a second C1-decoding method in response to a determination that the number of elements in the second list is less than the first integer variable;
determining whether the second decoding of the C1-codeword failed;
adding a location of the C1-codeword to the first list in response to a determination that the second decoding of the C1-codeword failed;
incrementing the C1 iteration counter to indicate completion of a C1 iteration; and
stopping C1 decoding in response to a determination that the C1 iteration counter is greater than or equal to the predetermined number of allowed C1 iterations.

11. The method as recited in claim 8, wherein the C2 decoding all second subsets of the set of data further comprises:

setting a C2 iteration counter to zero and empty a second list; and in an iterative process until the set of decoded data is output or a predetermined number of allowed C2 iterations have occurred:

decoding a C2-codeword using the first C2-decoding method;

determining whether to stop decoding the C2-codeword based on a number of errors remaining in the C2-codeword after first decoding thereof;

determining whether a number of elements in a first list is less than a second integer variable, the second integer variable being set to at least two;

decoding the C2-codeword using a second C2-decoding method in response to a determination that the number of elements in the first list is less than the second integer variable;

determining whether the second decoding of the C2-codeword failed;

adding a location of the C2-codeword to the second list in response to a determination that the second decoding of the C2-codeword failed;

incrementing the C2 iteration counter to indicate completion of a C2 iteration; and stopping C2 decoding in response to a determination that the C2 iteration counter is greater than or equal to the predetermined number of allowed C2 iterations.

12. The method as recited in claim 8, wherein the set of data is arranged in a data array having rows and columns, wherein the first subset of data is either the rows or the columns of the data array, wherein the second subset of data is the rows when the first subset is the columns, and wherein the second subset of data is the columns when the first subset is the rows.

13. The method as recited in claim 8, wherein the C1 decoding all first subsets of the set of data further comprises:

setting a first list to empty;

decoding all C1-codewords using a first C1-decoding method;

setting a first failure variable as a number of C1-codewords which failed to decode successfully;

decoding a subset of C1-codewords using a second C1-decoding method with erasure locations indicated in a second list, the subset of C1-codewords including all those C1-codewords which failed to C1 decode successfully in response to a determination that a number of elements in the second list is less than a first integer variable; and updating the first list to include all C1-codewords which failed to successfully decode, wherein the first C1-decoding method is error-only decoding and the second C1-decoding method is error-and-erasure decoding.

14. The method as recited in claim 13, wherein the C2 decoding all second subsets of the set of data further comprises:

setting the second list to empty;

decoding all C2-codewords using the first C2-decoding method;

setting a second failure variable as a number of C2-codewords which failed to decode successfully;

decoding a subset of C2-codewords using a second C2-decoding method with erasure locations indicated in the first list, the subset of C2-codewords including all those C2-codewords which failed to C2 decode successfully in response to a determination that a number of elements in the first list is less than a second integer variable; and updating the second list to include all C2-codewords which failed to successfully decode, wherein the first C2-decoding method is error-only decoding and the second C2-decoding method is error-and-erasure decoding.

* * * * *